(12) United States Patent
Higuchi et al.

(10) Patent No.: US 11,192,781 B2
(45) Date of Patent: Dec. 7, 2021

(54) SEMICONDUCTOR DEVICE HAVING SILICON LAYER WITH TRENCH

(71) Applicant: DENSO CORPORATION, Kariya (JP)

(72) Inventors: Takahiro Higuchi, Kariya (JP); Yusuke Kawai, Kariya (JP); Sumio Ito, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/376,336

(22) Filed: Apr. 5, 2019

(65) Prior Publication Data
US 2019/0315622 A1     Oct. 17, 2019

(30) Foreign Application Priority Data
Apr. 16, 2018 (JP) .............. JP2018-078589

(51) Int. Cl.
*B81B 3/00* (2006.01)
*B81C 1/00* (2006.01)
*H01L 21/3065* (2006.01)

(52) U.S. Cl.
CPC ........ *B81C 1/00531* (2013.01); *B81B 3/0021* (2013.01); *B81B 2201/0242* (2013.01); *B81B 2203/0118* (2013.01); *H01L 21/30655* (2013.01)

(58) Field of Classification Search
CPC ....... H01L 21/76898; H01L 2924/1461; H01L 21/30655; H01L 29/84; G01P 15/125; G01P 15/0802; G01P 2015/082; B81B 2201/0242; B81B 2203/0136; B81B 2201/0235; B81B 3/0086; B81B 2201/0257; B81B 2201/0264; B81B 2203/0127; B81B 3/0021
USPC ................ 257/415, 419, E21.218, E21.577, 257/E29.324; 438/50, 52, 53, 640
See application file for complete search history.

(56) References Cited

U.S. PATENT DOCUMENTS

| 6,319,797 | B1 | 11/2001 | Usami | |
|---|---|---|---|---|
| 6,686,234 | B1 | 2/2004 | Hayashi | |
| 2004/0084701 | A1* | 5/2004 | Kanaya | H01L 27/11502 257/295 |
| 2004/0187574 | A1* | 9/2004 | Hayashi | G01C 19/5628 73/514.16 |
| 2005/0099100 | A1* | 5/2005 | Kita | G11B 5/5552 310/367 |
| 2007/0281474 | A1 | 12/2007 | Suzuki et al. | |
| 2012/0247207 | A1* | 10/2012 | Takaoka | G01C 19/5769 73/504.12 |
| 2013/0175643 | A1* | 7/2013 | Berthelot | G01P 15/0802 257/415 |

(Continued)

FOREIGN PATENT DOCUMENTS

JP     2005-142265 A    6/2005

*Primary Examiner* — David Chen
(74) *Attorney, Agent, or Firm* — Posz Law Group, PLC

(57) ABSTRACT

A semiconductor device includes: a silicon layer in which a trench is disposed; a surface structure portion disposed on the silicon layer at a position distant from the trench and having a surface provided by a metal layer; and a low electric conductivity portion disposed on the surface of the metal layer or in a part of the resist disposed on the trench side of the metal layer, and having an electric conductivity lower than at least a part of the metal layer covering a trench side portion of the surface of the metal layer.

6 Claims, 9 Drawing Sheets

(56) References Cited

U.S. PATENT DOCUMENTS

| | | | |
|---|---|---|---|
| 2015/0069581 A1* | 3/2015 | Chang | H01L 27/00 |
| | | | 257/622 |
| 2015/0340588 A1* | 11/2015 | Natori | G01C 19/56 |
| | | | 310/365 |
| 2017/0309468 A1* | 10/2017 | Shirai | B08B 3/08 |
| 2018/0148318 A1* | 5/2018 | Flynn | B81C 1/0069 |
| 2018/0175794 A1* | 6/2018 | Yamazaki | H01L 41/09 |
| 2019/0097120 A1* | 3/2019 | Konishi | H01L 41/053 |

* cited by examiner

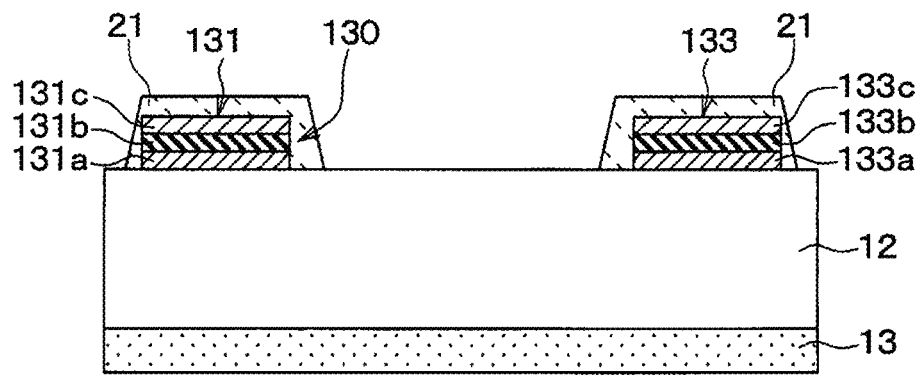
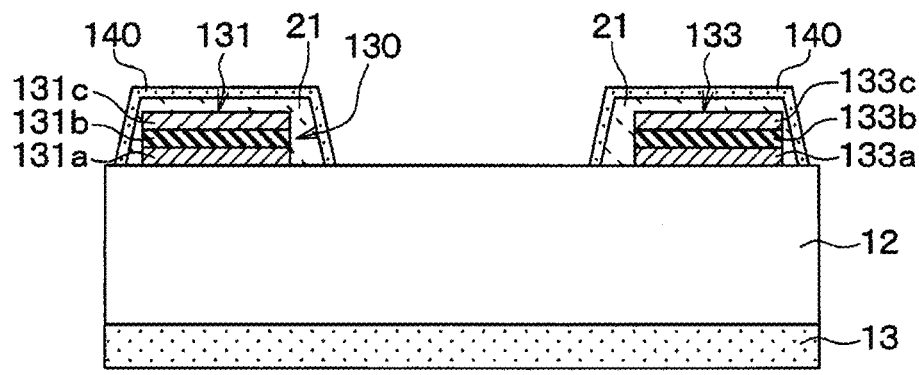
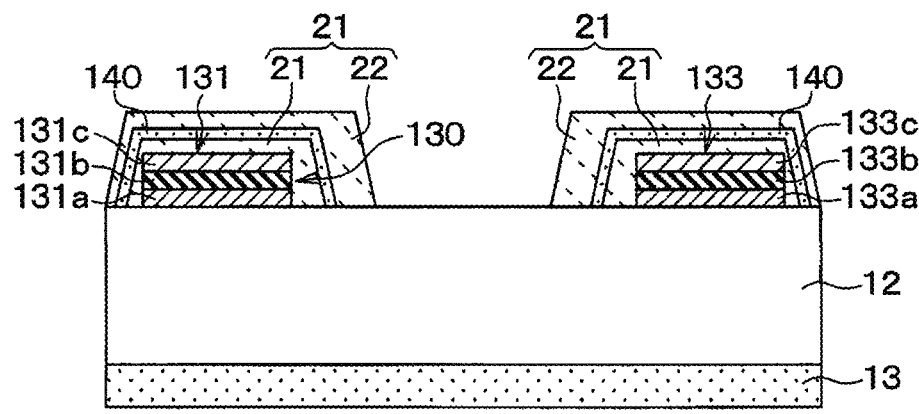

SEMICONDUCTOR DEVICE HAVING SILICON LAYER WITH TRENCH

CROSS REFERENCE TO RELATED APPLICATION

The present application claims the benefit of priority from Japanese Patent Application No. 2018-78589 filed on Apr. 16, 2018. The entire disclosure of the above application is incorporated herein by reference.

TECHNICAL FIELD

The present disclosure relates to a semiconductor device in which a trench is formed in silicon and a method for manufacturing the same.

BACKGROUND

Conventionally, a Bosch process is known as a technique for forming a trench with respect to silicon. The Bosch process is a method of forming trenches with a high aspect ratio by etching to proceed milling the bottom of a trench while protecting the sidewall of the trench with a protection film.

SUMMARY

A semiconductor device includes: a silicon layer in which a trench is disposed; a surface structure portion disposed on the silicon layer at a position distant from the trench and having a surface provided by a metal layer; and a low electric conductivity portion disposed on the surface of the metal layer or in a part of the resist disposed on the trench side of the metal layer, and having an electric conductivity lower than at least a part of the metal layer covering a trench side portion of the surface of the metal layer.

BRIEF DESCRIPTION OF THE DRAWINGS

The above and other objects, features and advantages of the present disclosure will become more apparent from the following detailed description made with reference to the accompanying drawings. In the drawings:

FIG. 8A is a cross-sectional view of a vibration angular velocity sensor during a manufacturing process according to a second embodiment;

FIG. 8B is a cross-sectional view of the vibration type angular velocity sensor during the manufacturing process continued from FIG. 8A;

FIG. 8C is a cross-sectional view of the vibration angular velocity sensor during the manufacturing process continued from FIG. 8B;

DETAILED DESCRIPTION

Figure 1:
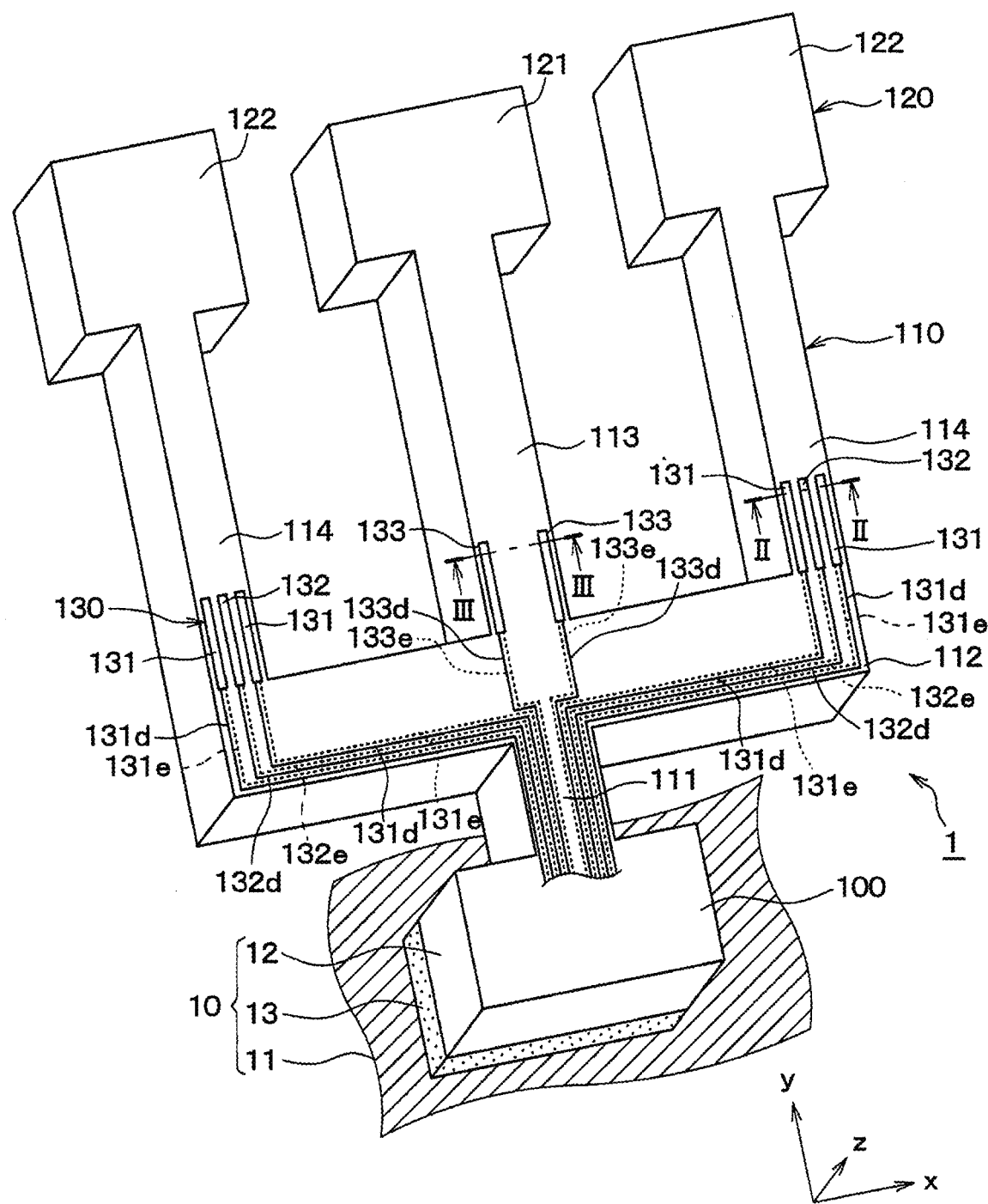
FIG. 1 is a perspective view of a vibration type angular velocity sensor according to a first embodiment.

In the Bosch process, a processed side surface of the trench may have a concave-convex shape, and a recess defined as a notch in which the bottom of the trench is widened in the lateral direction compared to the upper side may be formed. Specifically, in the Bosch process, a protecting step of the side surface with a protection film and an etching step of the bottom of the trench are repeated. In this case, since the etching is also performed isotropically rather than completely anisotropically, the surface roughness is formed each time etching is repeated. For this reason, the processed side surface of the trench has a concave-convex shape. In the Bosch process, the etching is performed by irradiating plasma ions in an etching gas, and the etching proceeds by bombarding positive ions to silicon material. However, at the time of etching, positive charges are charged up at the bottom of the trench, so that positive ions in the etching gas are repulsive, and the etching progresses in the lateral direction, thereby forming a notch.

As described above, when the side surface of the trench is formed into a rough shape or a notch is formed at the bottom of the trench, break-down or the like due to stress concentration may occur, and the reliability of the semiconductor device may be lowered. Further, in the case of forming a structure in which a moisture-proof film is formed on the inner wall surface of the trench, the film quality of the moisture-proof film may not be made uniform.

There is also a method of additionally performing dry etching or hydrogen annealing in order to flatten the processed side surface of the trench. However, if metals such as wirings are formed on the silicon surface, usable etching conditions may become narrow. It is confirmed by experiments that the dry etching amount varies when the distance from the trench to the wiring is different. In this way, since the roughness of the side surface of the trench changes depending on the location, optimization is difficult and an additional process is required, so that the process time is increased and the productivity is lowered.

In example embodiments, a semiconductor device and a manufacturing method of the same having a structure of maintaining uniformity of a side surface of a trench are provided even when a distance from a trench to a metal material such as a wiring is changed.

According to an example aspect, a semiconductor device includes: a silicon layer in which a trench is disposed; a surface structure portion disposed on the silicon layer at a position distant from the trench and having a surface provided by a metal layer; and a low electric conductivity portion disposed on the surface of the metal layer and having an electric conductivity lower than at least a part of the metal layer covering a trench side portion of the surface of the metal layer.

In this manner, with respect to the surface structure portion arranged on the surface of the silicon layer, the low electric conductivity portion is provided so as to cover a portion where the surface is provided by the metal layer. As a result, even when the distance from the trench to the metal layer changes, the uniformity of the sidewall of the trench is improved.

According to an example aspect, a method for manufacturing a semiconductor device in which a trench is formed in a silicon layer, includes: preparing the silicon layer; forming a surface structure portion having a surface provided by a metal layer on the silicon layer at a position spaced apart from a trench-to-be-formed region where the trench is to be formed; forming a resist on the surface structure portion and the silicon layer; removing a part of the resist corresponding to the trench-to-be-formed region; forming the trench by etching the silicon layer by a Bosch process using the resist as a mask; and arranging a low electric conductivity portion having an electric conductivity lower than the metal layer on an upper surface of at least a part of the metal layer disposed on a trench-to-be-formed region side or in a part of the resist disposed on the trench-to-be-formed region side of the metal layer after the forming of the surface structure portion. The forming of the trench is performed under a state where the low electric conductivity portion is arranged.

In this manner, before the silicon layer is etched by the Bosch process, the low electric conductivity portion is arranged so as to cover the portion of the surface structure portion having the surface provided by the metal layer. As a result, even when the distance from the trench to the metal layer changes, the uniformity of the sidewall of the trench is improved.

Hereinafter, embodiments of the present disclosure will be described with reference to the drawings. In the following embodiments, the same or equivalent parts are denoted by the same reference numerals.

First Embodiment

A first embodiment will be described. Here, a vibration type angular velocity sensor, a so-called gyro sensor will be described as an example of a semiconductor device in which a trench is formed in silicon material. The vibration type angular velocity sensor is a sensor for detecting an angular velocity as a physical quantity and is used for detecting a rotational angular velocity about a center line parallel to the vertical direction of the vehicle, for example. Alternatively, the sensor may of course be applied to other than vehicles.

Hereinafter, the vibration angular velocity sensor according to the present embodiment will be described with reference to FIGS. 1 to 3.

The sensor element 1 of the vibration type angular velocity sensor is mounted on the vehicle such that the xy plane in FIG. 1 is oriented in the horizontal direction of the vehicle and the z-axis direction matches the vertical direction of the vehicle. The sensor element 1 of the vibration type angular velocity sensor is formed using a plate-like substrate 10. In the present embodiment, the substrate 10 includes an SOI (i.e., silicon on insulator) substrate having a structure in which a buried oxide film 13 serving as a sacrificial layer is sandwiched between a support substrate 11 and a silicon layer 12.

One direction of the plane of the substrate 10 is the x axis, the direction perpendicular to the x axis on this plane is the y axis, the direction perpendicular to the x axis and the y axis, i.e., a normal line direction of the plane is the z axis, and the plane of the substrate 10 is a plane parallel to the xy plane. The sensor element 1 is formed by using such a substrate 10, for example, the side of the silicon layer 12 is etched into the pattern of the sensor structure, the buried oxide film 13 is partially removed, and a part of the sensor structure is separated. An etching for forming a pattern of the sensor structure is an etching for forming a trench around the silicon layer 12, and the etching at this time is performed using the Bosch process.

In FIG. 1, although the support substrate 11 is described in a simplified manner, the substrate 11 is actually formed in a flat plate shape. Although FIG. 1 is not a cross-sectional view, a hatching shows the support substrate 11 and the buried oxide film 13 to be easily understandable.

The silicon layer 12 is patterned to be the fixed portion 100, the beam portion 110, and the movable portion 120. The fixed portion 100 has a state in which the buried oxide film 13 is left on at least a part of its back surface and is fixed to the support substrate 11 via the buried oxide film 13 without being released from the support substrate 11. The beam portion 110 and the movable portion 120 constitute a vibrator in the sensor element 1. The buried oxide film 13 is removed from the back side of the movable portion 120 and the movable portion 120 is separated from the support substrate 11. The beam portion 110 supports the movable portion 120 and displaces the movable portion 120 on the xy plane in order to detect the angular velocity.

Specifically, the beam portion 110 is configured to include a support beam 111, a support member 112, a detection beam 113, and a drive beam 114. In addition, the movable portion 120 is configured to include a detection weight 121 and a drive weight 122.

A cantilever support beam 111 is formed from one side of a fixed portion 100 having a square upper surface shape, and a support member 112 is extended in a direction perpendicular to the support beam 111. At a central position of the support member 112, a support beam 111 is connected to the support member 112. A detection beam 113 is formed on the side opposite to the support beam 111 with the support member 112 interposed therebetween. A detection weight 121 is provided at the tip of the detection beam 113, and a drive beam 114 is formed on both ends of the support member 112 in the same direction as the support beam 111, and a drive weight 122 is provided at the tip of the driving beam 114.

With such a structure, one end side of the support beam 111 is fixed to the fixed portion 100, and the detection beam 113, the detection weight 121, the drive beam 114, and the drive weight 122 are supported by the other end side of the support beam 111 via the support member 112 so that each portion is cantilevered in the fixed portion 100.

In addition, a drive portion 131 is formed on the drive beam 114 and a control unit 132 is formed on the drive beam 114, and a vibration detection unit 133 is formed on the detection beam 113. The drive portion 131, the control unit 132, and the vibration detection unit 133 are electrically connected to a control device (not shown) arranged outside the sensor, so that the vibration type angular velocity sensor is operated.

As shown in FIG. 1, the drive portion 131 is arranged in the vicinity of the connecting part between the drive beam 114 and the support member 112, and two of the drive portions 131 are disposed at each place with a predetermined distance from each of the drive portions 131, and the drive portion 131 is extended in the y-axis direction. As shown in FIG. 2, the drive portion 131 has a structure in which a lower layer electrode 131a, a drive thin film 131b, and an upper layer electrode 131c are stacked in this order on the surface of the silicon layer 12 constituting the drive beam 114. The lower layer electrode 131a and the upper layer electrode 131c are made of, for example, an Al electrode or the like. The lower layer electrode 131a and the upper layer electrode 131c are electrically connected to pads (not shown) for applying a driving voltage and pads (not shown) for connecting to a ground through wiring portions 131d and 131e drawn to the fixed portion 100 via the support member 112 and the detection beam 113 shown in FIG. 1. Further, the drive thin film 131b is made of a lead zirconate titanate (PZT) film, for example.

In such a configuration, by generating a potential difference between the lower layer electrode 131a and the upper layer electrode 131c, the drive thin film 131b sandwiched between the lower layer electrode 131a and the upper layer electrode 131c is displaced, and the drive beam 114 is forcibly vibrated, so that the drive weight 122 is driven and vibrated in the x-axis direction. For example, one of the drive portions 131 is arranged on both end sides of each driving beam 114 in the x axis direction, and the drive thin film 131b of one drive portion 131 is displaced by compressive stress and the drive thin film 131b of the other drive portion 131 is displaced by tensile stress. By alternately and repeatedly applying such voltage to each of the drive portions 131, the drive weights 122 are vibrated in the x-axis direction.

Figure 2:
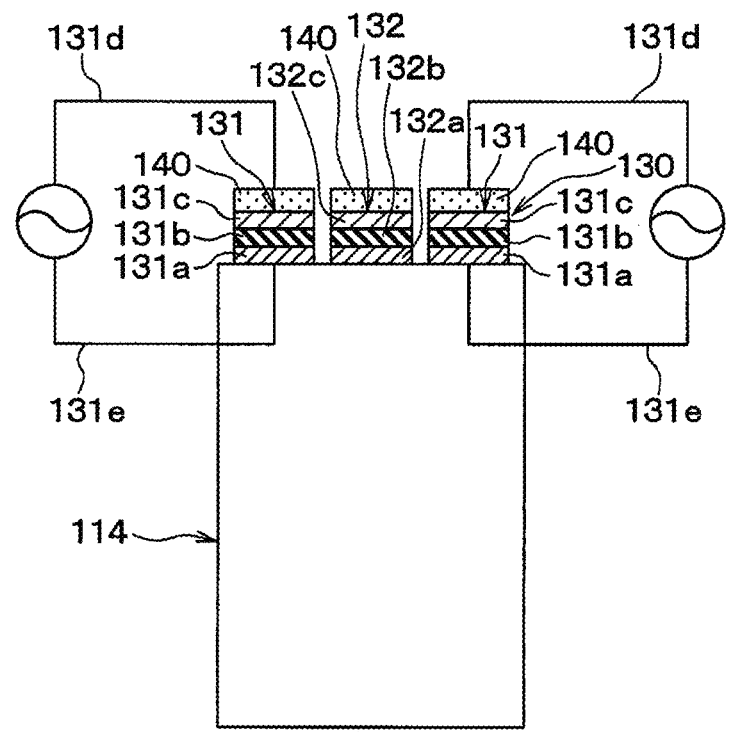
FIG. 2 is a cross-sectional view taken along line II-II in FIG. 1.

As shown in FIGS. 1 and 2, the control unit 132 is provided in the vicinity of the connecting part between the drive beam 114 and the support member 112, and the control unit 132 is arranged between two drive portions 131 disposed at the place, and spaced apart from each drive portion 131 by a predetermined distance, and extended in the y-axis direction. As shown in FIG. 2, the control unit 132 has a structure in which a lower layer electrode 132a, a drive thin film 131b, and an upper layer electrode 132c are stacked in this order on the surface of the silicon layer 12 constituting the drive beam 114. The lower layer electrode 132a, the upper layer electrode 132c, and the control thin film 132b are configured to have a similar structure as the lower layer electrode 131a, the upper layer electrode 131c, and the drive thin film 131b that constitute the drive portion 131. The lower layer electrode 132a and the upper layer electrode 132c are electrically connected to pads (not shown) for applying a control voltage and pads (not shown) for connecting to a ground through wiring portions 132d and 132e drawn to the fixed portion 100 via the support member 112 and the detection beam 113 shown in FIG. 1.

In such a configuration, by generating a potential difference between the lower layer electrode 132a and the upper layer electrode 132c, the control thin film 132b sandwiched therebetween is displaced, so that a desired vibration is applied to the drive beam 114. As a result, it is possible to control the vibration of the drive weight 122 and apply the vibration with suppressing unnecessary vibration.

Figure 3:
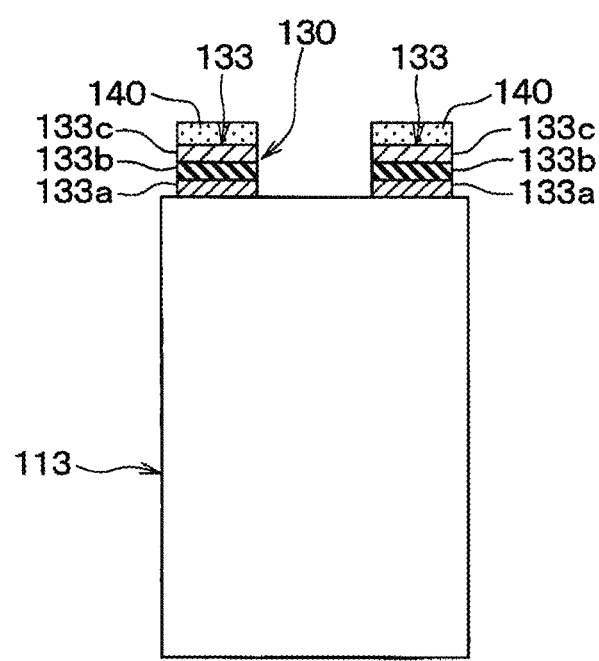
FIG. 3 is a cross-sectional view taken along the line III-III in FIG. 1.

As shown in FIGS. 1 and 3, the vibration detection unit 133 is arranged in the vicinity of the connecting part between the detection beam 113 and the fixed portion 100, and is arranged on each of both sides of the detection beam 113 in the x-axis direction, and extends in the y-axis direction. As shown in FIG. 3, the vibration detection unit 133 has a structure in which a lower layer electrode 133a, a detection thin film 133b, and an upper layer electrode 133c are stacked in this order on the surface of the layer 12 constituting the detection beam 113. The lower layer electrode 133a, the upper layer electrode 133c, and the detection thin film 133b are configured to have a similar structure as the lower layer electrode 131a, the upper layer electrode 131c and the driving thin film 131b constituting the vibration detection portion 133, respectively. The lower layer electrode 133a and the upper layer electrode 133c are connected to a pad (not shown) for outputting a detection signal through wiring portions 133d and 133e drawn to the fixed portion 100 shown in FIG. 1.

As described above, the surface structures of the drive portion 131, the control unit 132, the vibration detection unit 133, and the respective wiring portions 131d, 131e, 132d, 132e, 133d, 133e and the like are formed on the surface of the silicon layer 12. Hereinafter, these are collectively referred to as the surface structure portion 130. As shown in FIGS. 2 and 3, an insulation film 140 is formed on the surface structure portion 130. More specifically, a portion of the surface structure portion 130 from which the metal material is exposed is covered with the insulation film 140. The portions of the surface structure portion 130 from which the metal material is exposed are the upper layer electrode 131c of the drive portion 131, the upper layer electrode 132c of the control unit 132, the upper layer electrode 133c of the vibration detection portion 133, and the respective wiring portions 131d and 131e, 132d, 132e, 133d, 133e.

The insulation film 140 constitutes a low electric conduction part, and is made of a material having a lower electric conductivity than the metal arranged on the surface of the surface structure portion 130, preferably made of a material having a lower thermal conductivity than the metal. Examples of such materials include $SiO_2$, SiOC, SiC, SiN, $Al_2O_3$ and the like. Here, the insulation film 140 is formed of a TEOS film which is an $SiO_2$ film deposited by a plasma CVD (chemical vapor deposition) method using a solution including tetraethoxysilane (hereinafter referred to as TEOS).

By thus covering the surface structure portion 130 with the insulation film 140, it is possible to restrict the surface structure portion 130 from being electrically and thermally affected by an external system. For example, it is possible to improve resistance to electric noise and temperature characteristics and a SN ratio. Therefore, it is possible to stabilize the sensor characteristics.

As described above, the vibration type angular velocity sensor according to the present embodiment is configured. The vibration type angular velocity sensor having such a configuration is operated by applying a driving voltage to the drive portion 131 included in the drive beam 114.

Specifically, a potential difference is generated between the lower layer electrode 131*a* and the upper layer electrode 131*c*, thereby displacing the drive thin film 131*b* sandwiched therebetween. Then, among two drive portions 131 arranged side by side, the drive thin film 131*b* of one drive portion 131 is displaced by compressive stress and the drive thin film 131*b* of the other drive portion 131 is displaced by tensile stress. By alternately and repeatedly applying such voltage to each of the drive portions 131, the drive weights 122 are vibrated in the x-axis direction. As a result, the drive mode in which the drive weights 122 supported by the respective drive beams 114 are moved in opposite directions in the x-axis direction with the detection weight 121 therebetween is provided. Thus, the drive weights 122 are both in a mode in which the detection weight 121 approaches and the detection weight 121 moves away from each other.

When an angular velocity is applied to the vibration type angular velocity sensor while performing this driving vibration, the detection mode in which the detection weight 121 vibrates on the XY plane is provided. Accordingly, when the detection beam 113 is displaced, and the detection beam 113 is also displaced, the detection thin film 133*b* arranged in the vibration detection section 133 deforms and the electric signal between the lower layer electrode 133*a* and the upper layer electrode 133*c* is changed. Specifically, when the vibration type angular velocity sensor is driven at a constant voltage, the current value is changed as an electric signal, and when the vibration type angular velocity sensor is driven at a constant current, the current value is changed as an electric signal. A change in the electric signal is output to the external system through a detection signal output pad (not shown) as a detection signal indicating the angular velocity, and is input to a control device or the like (not shown) arranged outside the sensor, so that the generated angular velocity is detectable.

Here, in the above-described vibration type angular velocity sensor, the sensor structure is prepared by, for example, forming each part included in the surface structure portion 130 in the silicon layer 12, and then, patterning the silicon layer 12, and the unnecessary portion of the buried oxide film 13 is removed, so that the sensor is completed. The patterning of the silicon layer 12 is performed by etching the periphery of the portion to be a sensor structure to form a trench.

At this time, by maintaining the uniformity of the side surface of the trench and flattening the surface, it is possible to suppress deterioration of the reliability of the sensor structure and to secure the reliability of the vibration type angular velocity sensor. That is, if the side surface of the trench is uneven or a notch is formed at the bottom of the trench, damage due to stress concentration may occur and the reliability of the vibration type angular velocity sensor may decrease. However, when the uniformity of the side surface of the trench is maintained, the reliability of the vibration type angular velocity sensor can be secured.

Although the surface of the sensor structure is not covered with the protection film, alternatively, it is also possible to protect the surface of the sensor structure by covering with the protection film, for example, to protect the surface structure portion 130. In that case, when the uniformity of the side surface of the trench is maintained, the film quality of the protection film can be made uniform and the reliability of the vibration type angular velocity sensor can be improved. Therefore, in this embodiment, the trench forming step is performed as shown in FIGS. 4A to 4D. Since the manufacturing method of the vibration type angular velocity sensor according to the present embodiment is the same as the conventional manufacturing method except for the trench forming step, only the trench forming step will be described here. Also, with respect to the drawings after FIG. 4A, the support substrate 11 is not shown.

Figure 4A:
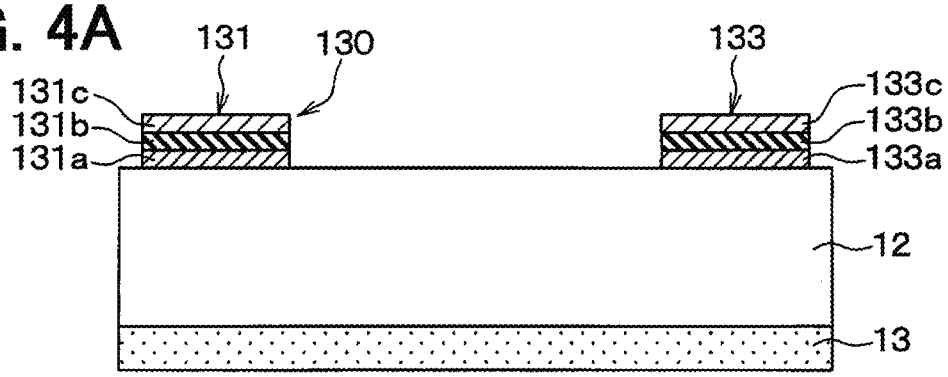
FIG. 4A is a cross-sectional view of the vibration type angular velocity sensor shown in FIG. 1 during a manufacturing process.

[Process Shown in FIG. 4A]

First, an SOI substrate in which the buried oxide film 13 is sandwiched between the support substrate 11 and the silicon layer 12 is prepared, and the surface structure portion 130 is formed on the silicon layer 12.

Figure 4B:
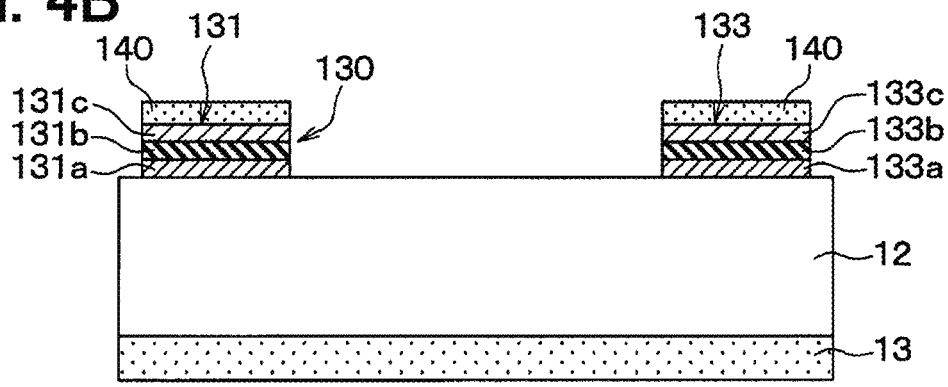
FIG. 4B is a cross-sectional view of the vibration type angular velocity sensor during the manufacturing process continued from FIG. 4A.

[Process Shown in FIG. 4B]

Subsequently, the insulation film 140 is formed so as to cover the metal exposed on the surface of the surface structure portion 130, and the film 140 is patterned so that the insulation film 140 is terminated at least at a position away from the region to be the trench formation region. Here, the insulation film 140 is left over the entire surface of the surface structure portion 130. The "separated position" means that there is a distance between the end portion of the insulation film 140 on the side of the trench 30 formed in the later step and the side surface of the trench 30. That is, the end portion of the insulation film 140 on the side of the trench 30 and the side surface of the trench 30 are not disposed on the same plane, but the end portion of the insulation film 140 is positioned outside the trench 30, and the insulation film 140 does not provide a mask for forming the trench 30.

Figure 4C:
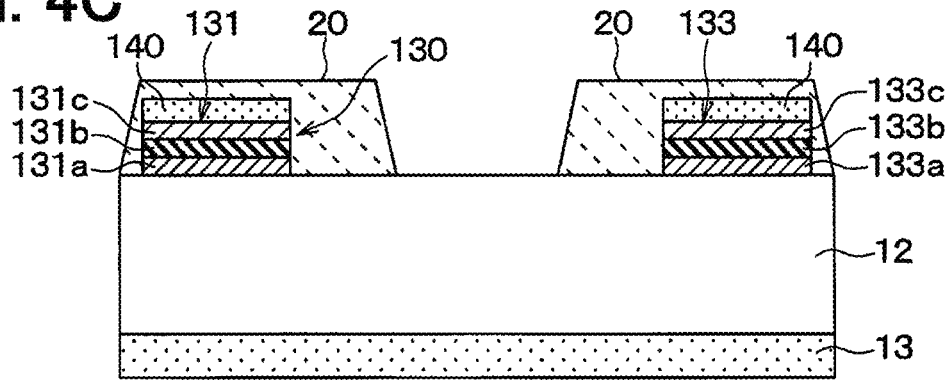
FIG. 4C is a cross-sectional view of the vibration angular velocity sensor during the manufacturing process continued from FIG. 4B.

[Process Shown in FIG. 4C]

The resist 20 is deposited so as to cover the entire surface structure portion 130 including the silicon layer 12 and the insulation film 140. As the resist 20, a general positive resist which is not a conductive resist is used, such as a thermosetting thick film resist or the like. Then, the resist 20 is patterned by photo lithography, and the resist 20 in the region to be the trench formation region is removed. As a result, the portion of the silicon layer 12 that is not removed, such as the sensor structure, is covered with the resist 20. In addition, since the insulation film 140 is terminated at a position distant from the trench formation scheduled region, all of the open ends on the side of the trench formation scheduled region are provided by the resist 20, and the insulation film 140 is not exposed.

Figure 4D:
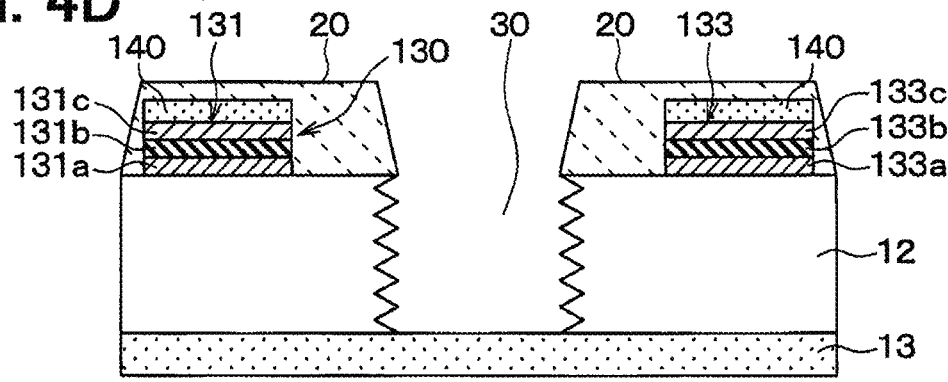
FIG. 4D is a cross-sectional view of the vibration angular velocity sensor during the manufacturing process continued from FIG. 40.

[Process Shown in FIG. 4D]

Using the resist 20 as a mask, the etching process based on the Bosch process is performed to form the trench 30. For example, while covering the side surface of the trench 30 with a protection film (not shown), the plasma ion etching or the like is performed to etch the bottom of the trench 30 so as to form a trench 30, and the etching process is performed until the buried oxide film 13 is exposed.

Here, as a comparative example, the case where the insulation film 140 is not arranged and the case where the insulation film 140 is arranged as in the present embodiment will be assumed for the etching process.

In the case of etching by the plasma ion etching method, an etching object is placed on the setting electrode, a high frequency bias is applied while introducing an etching gas, and the gas plasma is generated. As a result, positive ions of the gas plasma are irradiated to the bottom of the trench 30, and the etching progresses.

At this time, inherently, positive ions of the gas plasma are irradiated in the normal direction to the surface of the silicon layer 12, that is, in the depth direction of the trench 30. However, if a metal not covered with the resist is disposed in the vicinity of the region where the trench is to be formed, it is confirmed that positive ions are irradiated obliquely since the ions have a lateral speed component, and the ions collide on the side surface of the trench 30. This is confirmed based on the fact that a concave portion is formed on the side surface of the trench 30 near the opening of the trench 30, and the concave portion includes a vertical scratch defined as a scallop. Although this mechanism is not clear, it is presumed that the mechanism is as follows.

Figure 5A:
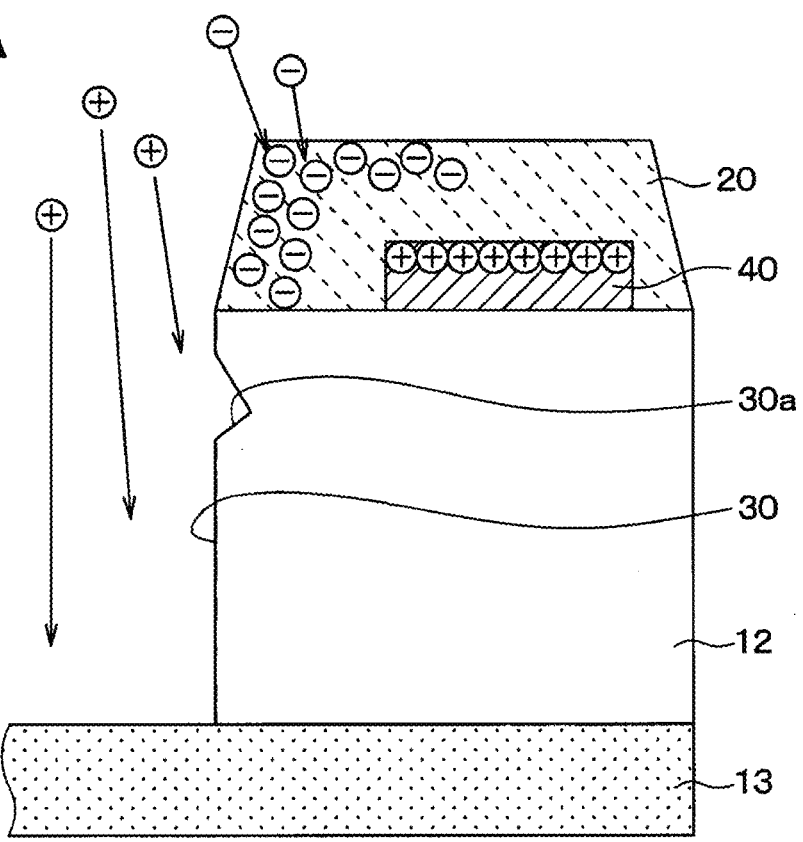
FIG. 5A is a cross-sectional view showing a state during an etching process in a case where a metal is not covered with an insulation film.

As shown in FIG. 5A, negative ions of the gas plasma originally are charged up on the surface of the resist 20, and therefore, the charge-up to the surface of the resist 20 is increased based on positive charge of the metal 40. For this reason, it is assumed that positive ions are pulled to negative ions charged up on the resist 20 so as to have a lateral component and the ions are obliquely irradiated.

According to experiments, the closer the distance from the metal 40 to the trench 30 is, the deeper the recess 30a made of the vertical scratch defined as scallop is, and the farther the distance is, the shallower the recess 30a is. This is because the nearer the positively charged metal 40 is located near the region where the trench is to be formed, the more the amount of negative ions charged up to the surface of the resist 20 becomes larger in the vicinity of the region where the trench is to be formed, and this influence becomes larger.

Figure 5B:
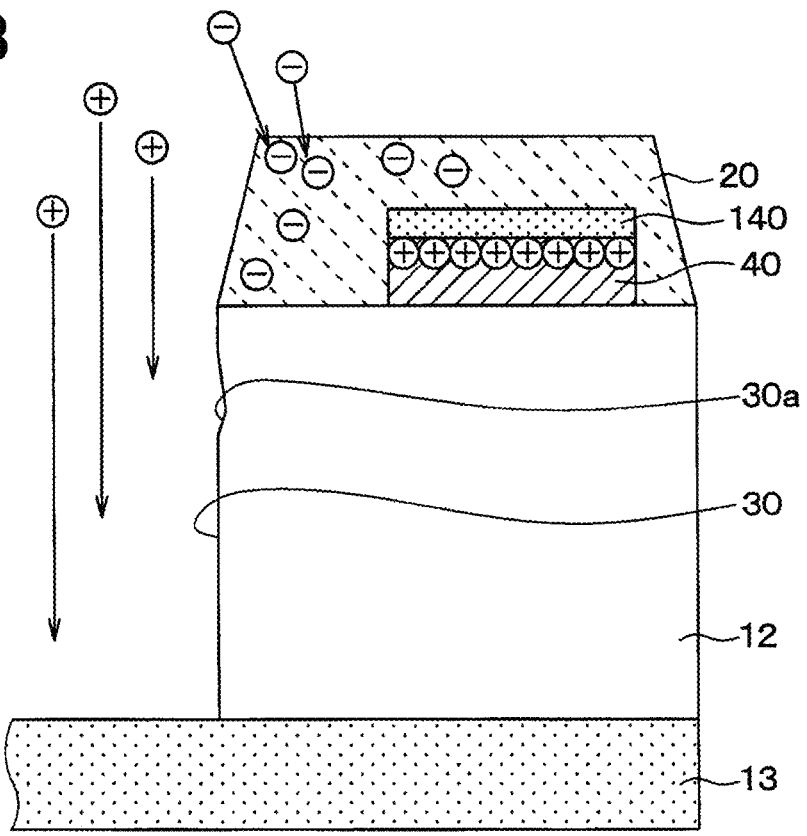
FIG. 5B is a cross-sectional view showing a state during an etching process in a case where a metal is covered with an insulation film.

On the other hand, as shown in FIG. 5B, after preparing the same structure as the present embodiment, that is the structure in which the insulation film 140 is arranged on the surface of the metal 40, the resist 20 is deposited, and the etching is performed using the resist 20 as a mask. In this case, the recess 30a is merely formed mildly, and the depth of the recess 30a is shallow. Also, irrespective of the distance from the metal 40 to the trench 30, there is almost no difference in the depth of the recess 30a.

When the surface of the metal 40 is covered with the insulation film 140, and even if the positive charging of the metal 40 occurs, it is considered that the insulation film 140 shields the charging, and suppresses an increase in charge-up of negative ions on the surface of the resist 20. That is, since an increase in charge-up of negative ions on the surface of the resist 20 is suppressed, it is possible to reduce the lateral direction component of positive ions of the gas plasma and to suppress the formation of the concave portion 30a on the side surface of the trench 30.

Figure 6A:
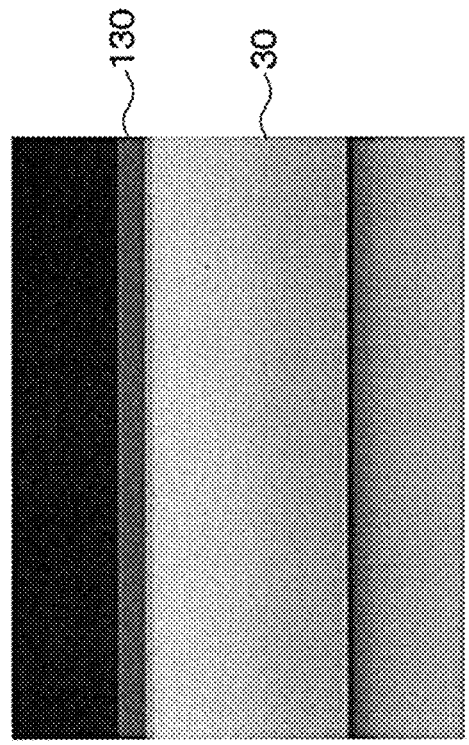
FIG. 6A is a photographic image and FIG. 6B is a diagram showing a contour figure of FIG. 6A, which show a state of a side surface of a trench when a TEOS film is formed to have a thickness of 150 μm.
Figure 6B:
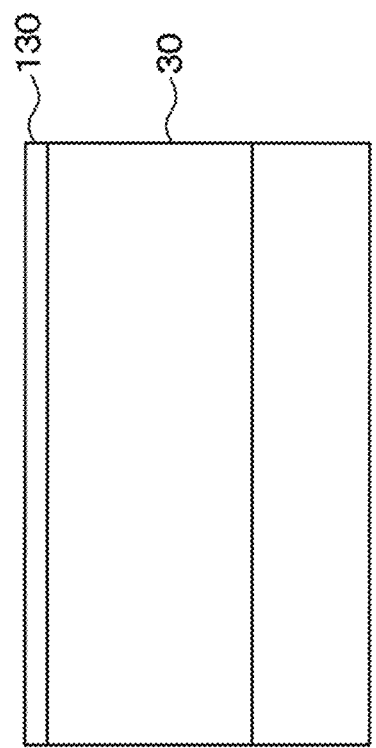

In this manner, by covering the portion of the surface structure portion 130 whose surface is made of metal with the insulation film 140, it is possible to improve the uniformity of the side surface of the trench 30. Therefore, it is possible to suppress deterioration in the reliability of the sensor structure, and it is possible to secure the reliability of the vibration type angular velocity sensor. For reference, the effects of using the TEOS film as the insulation film 140 are confirmed by experiments. In the experiment, the thickness of the TEOS film is varied at 10 μm, 80 μm, 150 μm, and 210 μm to ascertain how much the concave portion 30a is formed. As a result, in the case of using the TEOS film, almost no recess 30a is confirmed in any film thickness. FIG. 6A is a photographic image and FIG. 6B is a diagram showing a contour figure of FIG. 6A, which show a state of a side surface of a trench 30 when a TEOS film is formed to have a thickness of 150 μm. As shown in this figure, the recess 30a is almost not formed. By forming the insulation film 140 in this manner, it can be seen that the formation of the concave portion 30a is suppressed. In this case, the results obtained when the TEOS film is formed to have 150 μm thickness are shown. Alternatively, in the cases of 10 μm, 80 μm, and 210 μm thickness, the same result as in the case of 150 μm is obtained.

After the trench 30 is formed in this manner, unnecessary portions of the buried oxide film 13 are removed by isotropic etching, so that portions of the sensor structure other than the fixed portion 100 are released to provide a floating state, and the resist 20 is removed to complete the vibration type angular velocity sensor. In addition, if necessary, protection of each part of the sensor structure, for example, protection of each electrode of the drive portion 131, the control unit 132 and the detection unit 133 and various wirings may be performed by covering with a protection film (not shown). Even in such a structure, the film quality of the protection film is made uniform as long as the uniformity of the side surface of the trench is maintained. Therefore, it is possible to further improve the reliability of the vibration type angular velocity sensor.

As described above, in the present embodiment, the surface structure portion 130 formed on the surface of the silicon layer 12 in the sensor structure is provided with the insulation film 140 so as to cover the portion where the surface is made of metal. As a result, even when the distance from the trench 30 to the metal changes, it is possible to improve the uniformity of the side surface of the trench 30. That is, in the vibration type angular velocity sensor as in the present embodiment, the distance from each portion, which is the surface structure portion 130, to the trench 30 is not uniform and varies variously. Even with such a structure, the uniformity of the side surface of the trench 30 is improved. Therefore, it is possible to suppress deterioration in the reliability of the sensor structure, and it is possible to secure the reliability of the vibration type angular velocity sensor.

Modification of First Embodiment

Figure 7:
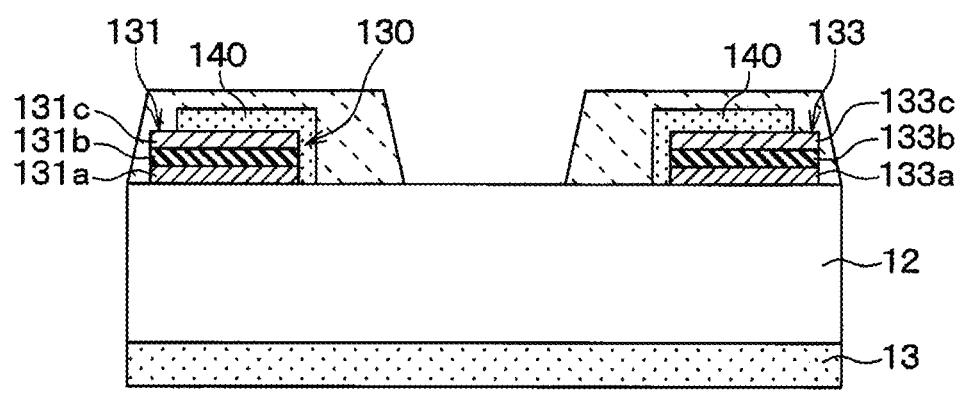
FIG. 7 is a cross-sectional view of a vicinity of a region where a trench is to be formed in a vibration angular velocity sensor described in a modification example of the first embodiment.

In the first embodiment, the insulation film 140 is formed on the entire upper surface of the surface structure portion 130. Alternatively, as shown in FIG. 7, the insulation film 140 may cover at least the trench formation scheduled region on the entire upper surface of the surface structure portion 130. In addition, as shown in FIG. 7, it is preferable that the end portion of the surface structure portion 130 on the side of the trench formation scheduled region is also covered with the insulation film 140 since the influence of the positive charging of the metal 40 is further reduced.

Second Embodiment

A second embodiment will be described. The present embodiment is different from the first embodiment in the step of forming the trench, and the other steps are the same as in the first embodiment, so only the difference from the first embodiment will be described.

In the present embodiment, the insulation film 140 is formed so as to be away from the surface structure portion 130, instead of directly forming the insulation film 140 so as to be in contact with the surface structure portion 130. Specifically, after performing the process shown in FIG. 4A described in the first embodiment, as shown in FIG. 8A, the first resist 21 that becomes a part of the resist 20 is formed so as to cover the surface structure portion 130. Then, the first resist 21 is patterned by photo lithography. At this time, while opening at least the trench formation scheduled region, the first resist 21 is left so that the entire surface of the surface structure portion 130 is covered.

Subsequently, as shown in FIG. 8B, an insulation film 140 is formed on the first resist 21, and the insulation film 140 is patterned to remain at a position corresponding to the surface structure portion 130. As a result, the insulation film 140 is formed at a position distant from the surface structure portion 130, and the surface structure portion 130 is covered with the insulation film 140. Further, as shown in FIG. 8C, after depositing the second resist 22 as the remainder of the resist 20, the second resist 22 is patterned by a photolithography to open the trench formation scheduled area. Thereafter, similar to FIG. 4D described in the first embodiment, the silicon layer 12 is etched to form the trench 30.

As described above, even when the insulation film 140 is separated from the surface structure portion 130, the insulation film 140 functions in the same manner as in the first embodiment at the time of etching for forming the trench 30, so that the side surface of the trench 30 is uniformed.

In a case where the insulation film 140 is separated from the surface structure portion 130 as in this embodiment, when the resist 20 is finally removed, the insulation film 140 does not remain on the surface structure portion 130. Therefore, as a vibration type angular velocity sensor, it is impossible to obtain the effect in the case where the insulation film 140 is left, but the side surface of the trench 30 is made uniform at least when forming the trench 30 by etching.

Modification of Second Embodiment

In the above-described second embodiment, an example of forming the insulation film 140 in a state away from the surface structure portion 130 is shown. Alternatively, other methods may be used.

Figure 9A:
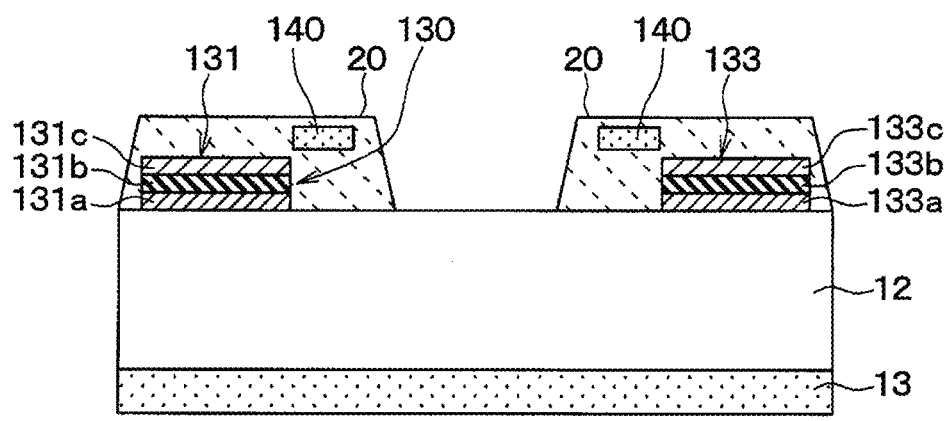
FIG. 9A is a cross-sectional view of a vicinity of a region where a trench is to be formed in a vibration angular velocity sensor described in a modification example of the second embodiment.

For example, as shown in FIG. 9A, even when the metal 40 is not covered, the insulation film 140 may be arranged on the side of the trench 30 with respect to the metal 40.

The method for forming the insulation film 140 may be a method different from the method described in the second embodiment or other materials having low electric conductivity instead of the insulation film 140 may be used. Alternatively, various shape other than a film shape may be used. For example, by irradiating the resist 20 with laser light, the resist 20 may be transformed so that a low electric conduction portion is constituted by this transformed portion.

Figure 9B:
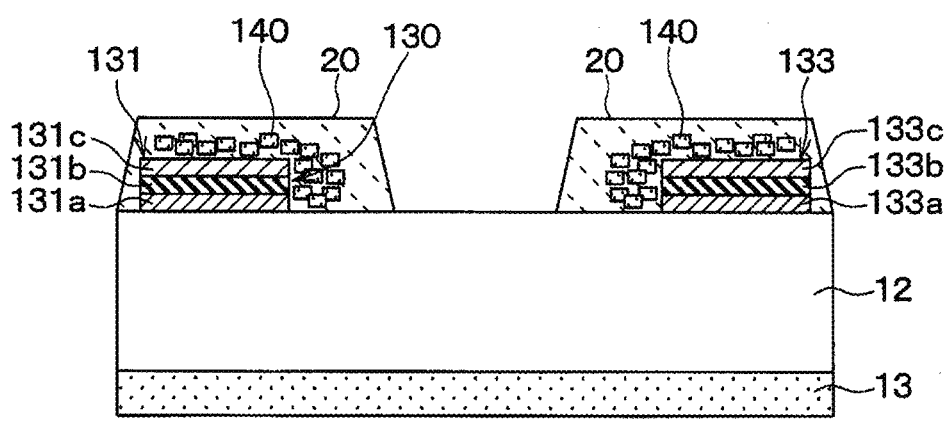
FIG. 9B is a cross-sectional view of a vicinity of a region where a trench is to be formed in a vibration angular velocity sensor described in a modification example of the second embodiment.

Alternatively, as shown in FIG. 9B, an insulation material may be mixed into the first resist 21 so that low electric conductivity portions are formed by dispersing insulating materials, and the second resist 22 without mixing an insulation material is deposited thereon.

Other Embodiment

The present disclosure is not limited to the above-described embodiment and may be suitably modified.

For example, in the above embodiment, a vibration type angular velocity sensor is described as an example of a semiconductor device in which the trench 30 is formed by the Bosch process. Alternatively, the present embodiments may be applied to other semiconductor devices. For example, it is preferably applied to a semiconductor device having a MEMS (Micro Electro Mechanical Systems) structure such as a vibration type angular velocity sensor. For example, a semiconductor device is a sensor in which a sensor structure is formed from a trench, such as a pressure sensor, an acceleration sensor, a MEMS mirror, a pMUT (piezoelectric ultrasonic transducer) structure, and the like. Also with respect to these other semiconductor devices, since the distance from the surface structure portion formed on the surface of the silicon layer to the trench is variously changed, by applying each of the above-described embodiments, the similar effect is obtained.

Further, in the above embodiment, the case where the recess 30a, which is a vertical scratch defined as a scallop, is formed is described. Alternatively, it is also possible to prevent the recess 30a from being formed by the manufacturing method of the above embodiment. In that case, it becomes possible to form a flat side surface on which the recessed portion 30a is not formed, and it is also possible to further improve the uniformity of the side surface of the trench 30.

Further, the case where the low electric conduction portion for suppressing the formation of the concave portion 30a is constituted by the insulation film 140 is described. Alternatively, other materials may be used as the low electric conduction portion. Specifically, as the low electric conduction portion, a material having a low electrical conductivity among metals, that is, a material having a lower electrical conductivity than Al or AlSi or the like generally used as a wiring or an electrode material, for example, Ti (titanium) may be used.

Figure 10A:
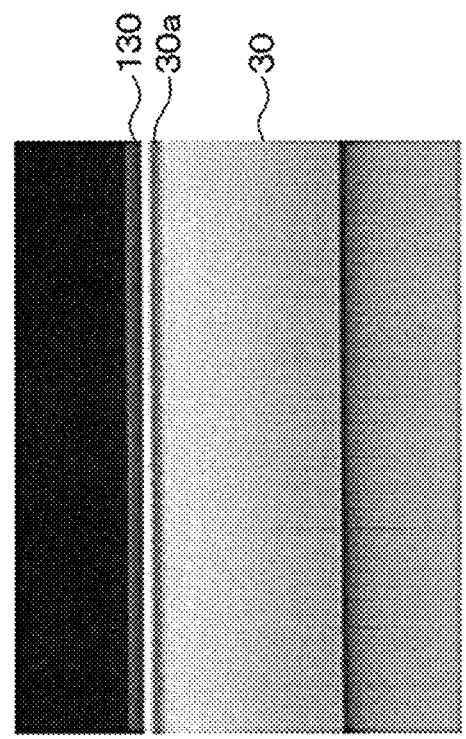
FIG. 10A is a photographic image and FIG. 10B is a diagram showing a contour figure of FIG. 10A, which show a state of a side surface of a trench when a Ti film is formed to have a thickness of 150 μm.
Figure 10B:
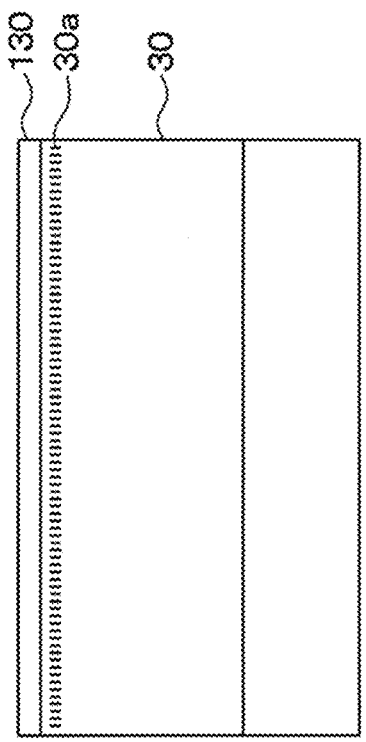

Experiments are conducted to investigate how the concave portion 30a is formed when the low electric conduction portion is made of a Ti film. In the experiment, the thickness of the TEOS film is varied at 10 μm, 80 μm, 150 μm, and 210 μm to ascertain how the concave portion 30a is formed. As a result, it is confirmed that, when the Ti film is used, the depth of the concave portion 30a is made smaller as compared with the case where the Ti film is not formed, and the depth of the concave portion 30a is reduced as the thickness of the Ti film is increased. FIG. 10A is a photographic image and FIG. 10B is a diagram showing a contour figure of FIG. 10A, which show a state of a side surface of a trench 30 when a TEOS film is formed to have a thickness of 150 μm. As shown in this drawing, although the concave portion 30a is formed, the concave portion 30a is small. In addition, when the Ti film is formed to have a thickness of 210 μm, the concave portion 30a is almost not found. In this manner, even when a metal having a low electrical conductivity such as a Ti film is used, formation of the recess 30a is suppressed.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device comprising:
  a silicon layer in which a trench is disposed;
  a surface structure portion disposed on the silicon layer at a position distant from the trench and having a surface provided by a metal layer; and
  a low electric conductivity portion disposed on the surface of the metal layer and having an electric conductivity lower than at least a part of the metal layer covering a trench side portion of the surface of the metal layer,
  wherein:
  the low electric conductivity portion is spaced apart from the trench;
  the surface structure portion includes a lower layer electrode, a deformable thin film, and an upper layer electrode;
  the low electric conductivity portion is arranged above the upper layer electrode of the surface structure portion, the low electric conductivity portion covers a side of the surface structure portion and a part of an upper surface of the surface structure portion closer to the trench, a distance between the metal layer and the trench is non-uniform;

a side of the silicon layer on which the metal layer is disposed is defined as an opening side of the trench;

a concave portion including a vertical scratch is arranged on a sidewall of the trench at the opening side of the trench; and a depth of the concave portion is uniform at a position of the trench where the distance between the trench and the metal layer is non-uniform.

2. The semiconductor device according to claim 1, wherein:

the low electric conductivity portion is made of an insulation film.

3. The semiconductor device according to claim 2, wherein:

the insulation film is an oxide film.

4. The semiconductor device according to claim 2, wherein:

the insulation film is a TEOS film.

5. The semiconductor device according to claim 1, wherein:

the trench disposed in the silicon layer provides an MEMS structure.

6. The semiconductor device according to claim 5, wherein:

the MEMS structure provides a sensor having a sensor structure in which the trench is arranged in the silicon layer.

* * * * *